(12) United States Patent
Poiesz et al.

(10) Patent No.: US 11,953,837 B2
(45) Date of Patent: Apr. 9, 2024

(54) METHOD, SUBSTRATE AND SYSTEM FOR ESTIMATING STRESS IN A SUBSTRATE

(71) Applicant: ASML Netherlands B.V., Veldhoven (NL)

(72) Inventors: Thomas Poiesz, Veldhoven (NL); Michel Ben Isel Habets, Eindhoven (NL); Abraham Alexander Soethoudt, Eindhoven (NL); Herman Marquart, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 365 days.

(21) Appl. No.: 17/423,818

(22) PCT Filed: Nov. 5, 2019

(86) PCT No.: PCT/EP2019/080270
§ 371 (c)(1),
(2) Date: Jul. 16, 2021

(87) PCT Pub. No.: WO2020/147992
PCT Pub. Date: Jul. 23, 2020

(65) Prior Publication Data
US 2022/0113640 A1    Apr. 14, 2022

(30) Foreign Application Priority Data
Jan. 18, 2019   (EP) .................................. 19152455.2

(51) Int. Cl.
*G03F 7/00*    (2006.01)

(52) U.S. Cl.
CPC ...... *G03F 7/70783* (2013.01); *G03F 7/70033* (2013.01)

(58) Field of Classification Search
CPC ........ A45D 29/001; A45D 31/00; C09D 5/24; B29L 2031/7286; C09J 7/25; C09J 7/38;
(Continued)

(56) References Cited

U.S. PATENT DOCUMENTS

| 5,303,574 A | 4/1994 | Matossian et al. |
| 6,129,609 A | 10/2000 | Ripper et al. |

(Continued)

FOREIGN PATENT DOCUMENTS

WO    WO 2018/077517 A1    5/2018

OTHER PUBLICATIONS

International Search Report and Written Opinion of the International Searching Authority directed to related International Patent Application No. PCT/EP2019/080270, dated Feb. 12, 2020; 13 pages.
(Continued)

*Primary Examiner* — Deoram Persaud
(74) *Attorney, Agent, or Firm* — Sterne, Kessler, Goldstein & Fox P.L.L.C.

(57) ABSTRACT

The present invention provides a testing substrate (W) for estimating stress in production substrates due to a substrate support, said testing substrate having a support surface (SS) divided into predefined portions, wherein the predefined portions comprise at least one first portion (1) having a first coefficient of friction being substantially uniform across the at least one first portion, and at least one second portion (2) having a second coefficient of friction being substantially uniform across the at least one second portion, wherein the second coefficient of friction is different to the first coefficient of friction. The present invention also provides a method for estimating stress in a substrate due to a substrate support and a system for making such an estimation.

15 Claims, 3 Drawing Sheets

Figure 1:
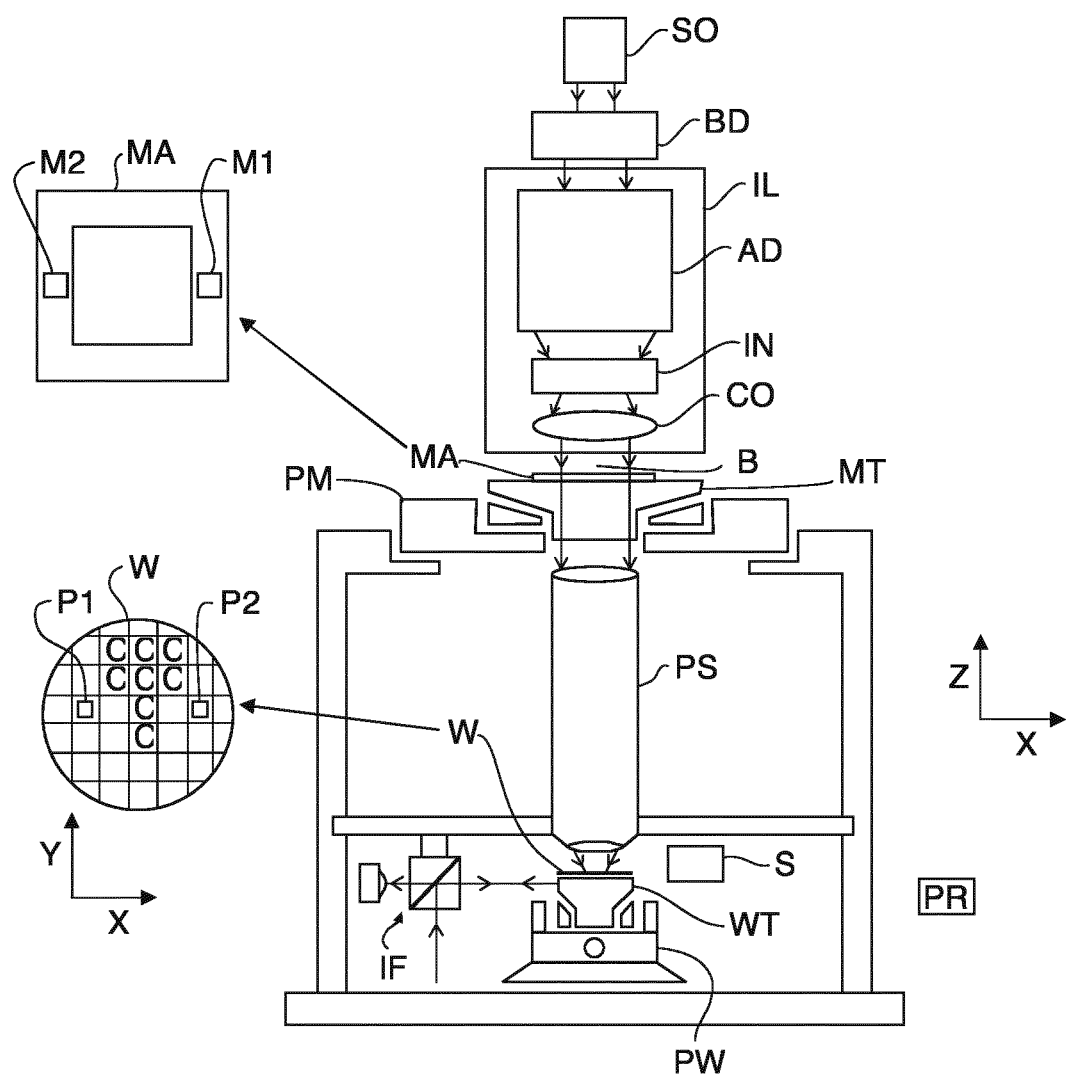

(58) Field of Classification Search
CPC .... C09J 7/401; H01L 21/02016; H01L 22/12; H04L 49/351; H04L 67/1097; G03F 7/70033; G03F 7/70783; B29C 33/68; B29C 35/02; B29C 37/0025; B29C 37/0053; B29C 63/02; B29C 65/48; G06F 13/16; G06F 13/4022; G06F 13/4068; G06F 13/4282; G06F 2213/0026; G06F 3/0604; G06F 3/0613; G06F 3/0631; G06F 3/0632; G06F 3/0635; G06F 3/0653; G06F 3/0658; G06F 3/067; G06F 3/0688; G06F 9/5072

See application file for complete search history.

(56) References Cited

U.S. PATENT DOCUMENTS

| | | | |
|---|---|---|---|
| 6,668,075 | B1 | 12/2003 | Nakamura et al. |
| 2002/0167006 | A1 | 11/2002 | Demizu et al. |
| 2004/0130312 | A1* | 7/2004 | Cooper ............... G01R 31/2887 324/140 R |
| 2005/0149886 | A1* | 7/2005 | Kaushal ............ H01L 21/67248 438/795 |
| 2006/0138681 | A1 | 6/2006 | Best et al. |
| 2006/0276977 | A1* | 12/2006 | Rosakis ................ G01L 5/0047 702/42 |
| 2007/0087529 | A1* | 4/2007 | Chung .............. H01L 21/76838 257/E21.582 |
| 2007/0180919 | A1* | 8/2007 | Rosakis ................ G01L 5/0047 702/127 |
| 2012/0099089 | A1 | 4/2012 | Sogard |
| 2015/0024177 | A1* | 1/2015 | Jeong ........................ C30B 5/00 117/4 |
| 2015/0044785 | A1 | 2/2015 | Fonseca et al. |
| 2016/0043007 | A1 | 2/2016 | Fonseca et al. |
| 2017/0271214 | A1 | 9/2017 | Kasa et al. |

OTHER PUBLICATIONS

International Preliminary Report on Patentability directed to related International Patent Application No. PCT/EP2019/080270, dated Jun. 16, 2021; 9 pages.

Li et al., "Relationship between coefficient of friction and surface roughness of wafer in nano machining process," Proceedings of SPIE, vol. 8793, Fourth International Conference on Smart Materials and Nanotechnology in Engineering, Aug. 2013; pp. 1-6.

* cited by examiner

METHOD, SUBSTRATE AND SYSTEM FOR ESTIMATING STRESS IN A SUBSTRATE

CROSS-REFERENCE TO RELATED APPLICATIONS

This application claims priority of EP application 19152455.2, which was filed on 18 Jan. 2019 and which is incorporated herein in its entirety by reference.

FIELD OF THE INVENTION

The present invention relates to a method for estimating stress in a substrate due to a substrate support, a system for making such an estimation, a substrate and a method of producing said substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

There is a continuing desire to manufacture devices, e.g. integrated circuits, with ever smaller features. Integrated circuits and other microscale devices are often manufactured using optical lithography, but other manufacturing techniques, such as imprint lithography, e-beam lithography and nano-scale self-assembly are known.

During manufacturing, the device is irradiated. It is important to ensure that the irradiation process is as accurate as possible. One of the issues with making the irradiation processes as accurate as possible is ensuring that the device to be irradiated is in the correct position. In order to control the position of the device, a substrate support can be used. Generally, a substrate will be supported by the substrate support whilst the substrate is being irradiated. When the substrate is positioned on the substrate support, friction between the substrate and the substrate support may prevent the substrate from flattening out over a surface of the substrate support. The substrate can be thought of as a "pancake" that is able to "wrinkle", i.e. that has in-plane deformations, resulting in significant distortion of images projected onto the substrate.

In further detail, during loading and unloading of a substrate, there can be issues relating to stresses formed in the substrate. In particular, when a substrate is loaded onto a substrate table, the point of contact between the substrate and the substrate table will generally change as the substrate is positioned on the table. In other words, there tends to be a rolling contact between the substrate and the substrate table supporting the substrate. The change in contact point between the substrate and the substrate table means that there is generally stress on the substrate during the loading process, i.e. when the substrate is positioned on the substrate table. This forms in-plane deformation within the substrate due to the way in which the substrate is loaded on the substrate.

This impacts overall performance when aligning multiple lithographic layers in integrated circuit manufacturing. To address this issue, the substrate support may be configured to reduce friction between the substrate and the substrate support to allow the substrate to move to a flatter position on the substrate support. However, it is beneficial to also try to determine the impact of the substrate support on the shape of the substrate when positioned on the substrate support so that any in-plane deformation in the substrate can be accounted for.

In general, the amount of in-plane deformation will change depending on the substrate support used for holding the substrate. In particular, the amount of friction between the substrate and the substrate table will be a large factor in determining the amount of deformation of the substrate. For example, when the friction is low, the substrate may slip over the contact with the substrate table and the deformation can be reduced. Therefore, with respect to in-plane deformation and stresses, it is beneficial to keep the friction as low as possible.

The in-plane deformation is an issue because it leads to variation in the position of markers used on the substrate to determine the position of the substrate. This can lead to errors, such as overlay errors, which can affect the efficiency of producing accurate substrates. Thus, there is an advantage to estimating the stress in a substrate due to a substrate support, so that the effect of the substrate support on a substrate can be accounted for. There are known measurement methods which compare different modes of loading a substrate onto a substrate table to estimate the frictional force acting on the substrate/stress in a substrate due to a substrate support due the loading process for a particular substrate table/support.

However, there is an issue that known measurement practices may not provide accurate enough measurements and/or take too long which reduces availability of the apparatus for a user.

Known measurement methods generally take a certain period to carry out. Time taken to carry out such measurements is time in which a lithographic apparatus is not being used to expose a substrate for use. Therefore, the process of measuring in-plane deformations of a substrate can reduce the available time for exposing a substrate and can therefore, reduce the efficiency of a lithographic apparatus. Based on this, there are advantages to providing a more streamlined way of estimating the stress in a substrate due to a substrate support which reduces the amount of time which needs to be carried out by a user testing a substrate table.

SUMMARY

It is desirable to provide a way of improving the way in which measurements are taken to estimate the impact of a substrate support on the substrate when situated on such support.

In the present invention, there is provided a method for estimating stress in a substrate due to a substrate support, the method comprising placing a substrate on a substrate support, the substrate having a support surface which is placed on the substrate support, wherein the support surface of the substrate is divided into predefined portions, wherein the predefined portions comprise at least one first portion and at least one second portion, the at least one first portion having a first coefficient of friction being substantially uniform across the at least one first portion and the at least one second portion having a second coefficient of friction being substantially uniform across the at least one second portion, wherein the second coefficient of friction is different to the first coefficient of friction, wherein the substrate comprises a further surface opposite the support surface, the further surface comprising a first feature positioned opposite the at least one first portion and a second feature positioned opposite the at least one second portion; measuring the location of the first feature and the second feature; estimating the stress in the substrate due to the substrate support using the measured location of the first feature and the second feature.

According to the present invention, there is also provided a substrate for use in a lithographic apparatus, the substrate having a support surface for interaction with a substrate support, wherein the support surface of the substrate is divided into predefined portions, wherein the predefined portions comprise at least one first portion and at least one second portion, the at least one first portion having a first coefficient of friction being substantially uniform across the at least one first portion and the at least one second portion having a second coefficient of friction being substantially uniform across the at least one second portion, wherein the second coefficient of friction is different to the first coefficient of friction.

According to the present invention, there is also provided a method of producing the substrate, wherein the method comprises: providing a substrate for use in a lithographic apparatus, the substrate having a support surface and a further surface opposite the support surface; and processing the support surface to generate at least one first portion having the first coefficient of friction being substantially uniform across the at least one first portion and/or at least one second portion having the second coefficient of friction being substantially uniform across the at least one second portion.

Further embodiments, features and advantages to the present inventions, as well the structure and operation of the various embodiments of the present invention, are described in detail below with reference to the accompanying drawings.

BRIEF DESCRIPTION OF THE DRAWINGS/FIGURES

The accompanying drawings, which are incorporated herein and form part of the specification, illustrate one or more embodiments of the present invention and, together with the description, further serve to explain the principals of the invention and to enable a person skilled in the pertinent art to make and use the invention.

FIG. 1 schematically depicts a lithographic apparatus.

Figure 2:
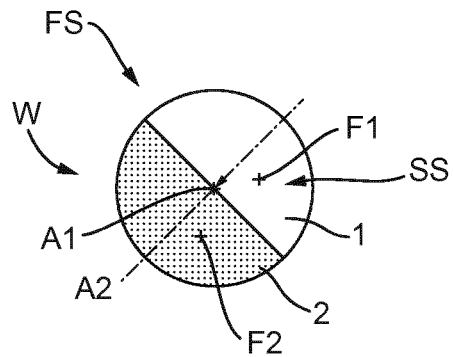

FIG. 2 schematically depicts a substrate of an embodiment.

Figure 3:
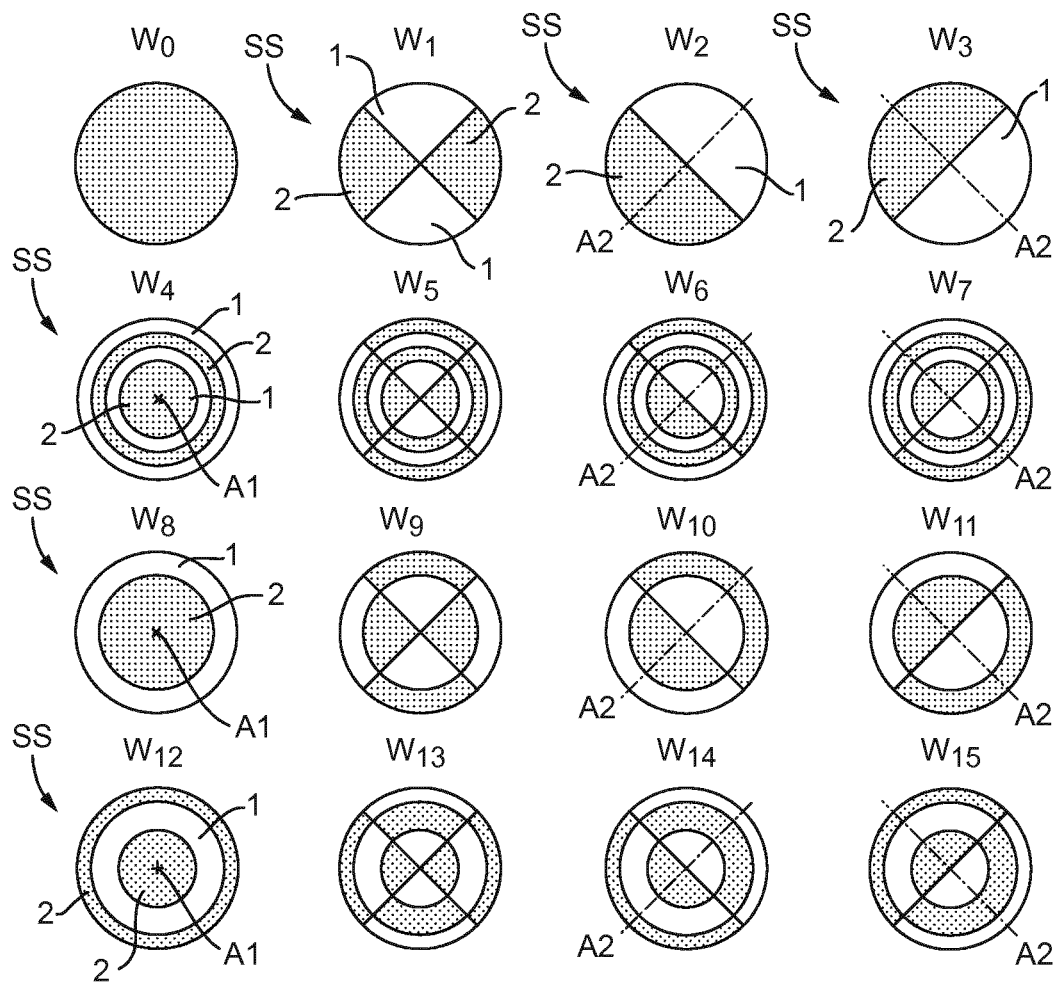

FIG. 3 schematically depicts variations of a substrate compared to a prior art example.

Figure 4:
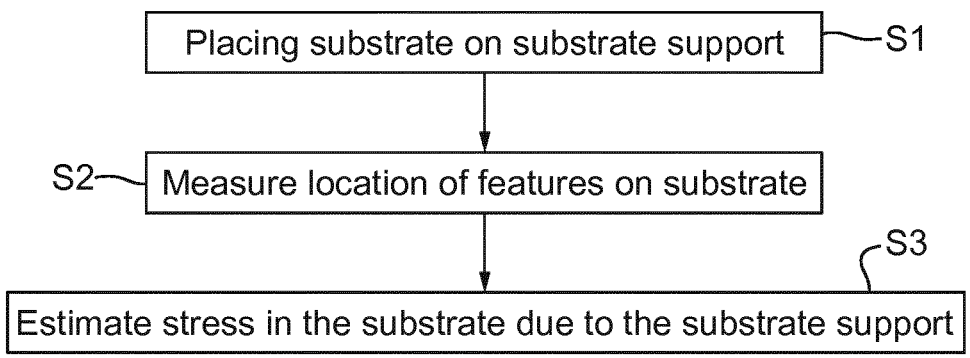
Figure 5:
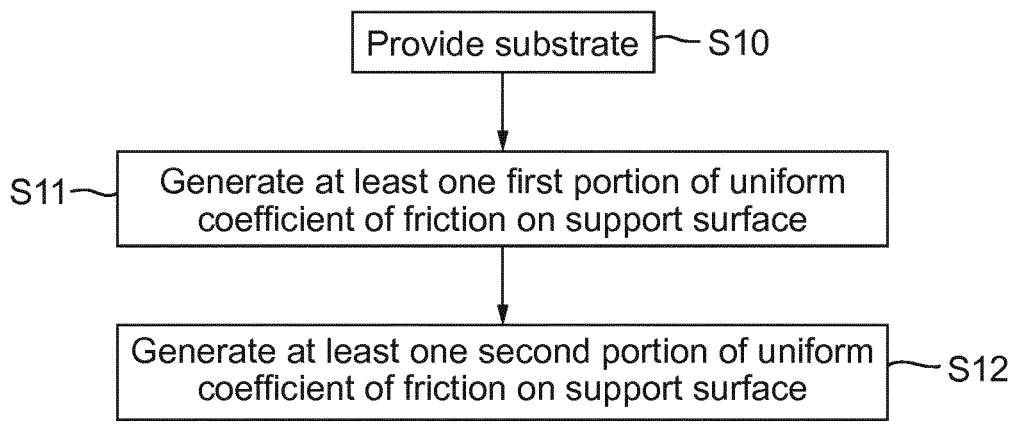

FIGS. 4 and 5 depict methods according to embodiments.

One or more embodiments of the present invention will now be described with reference to the accompanying drawings. The drawings provide an indication of certain features included in some embodiments of the invention. However, the drawings are not to scale. Examples of the size and range of sizes of certain features are described in the description below.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The lithographic apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The substrate support may comprise a substrate table WT (otherwise referred to as a chuck) on which a substrate holder is supported. The substrate holder may be configured to support the substrate W. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, to direct, shape, or control radiation.

The patterning device support holds the patterning device MA in a manner that depends on the orientation of the patterning device MA, the design of the lithographic apparatus, and other conditions, such as for example whether or not the patterning device MA is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device MA is at a desired position, for example with respect to the projection system PS. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam B may not exactly correspond to the desired pattern in the target portion of the substrate W, for example if the pattern includes phase-shifting features or so called assist features. Generally, the pattern imparted to the radiation beam B will correspond to a particular functional layer in a device being created in the target portion, such as an integrated circuit.

The patterning device MA may be transmissive or reflective. Examples of patterning devices MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device (e.g. mask) MA and the projection system PS Immersion techniques can be used to increase the numerical aperture of projection systems. The term "immersion" as used herein does not mean that a structure, such as a substrate, must be submerged in liquid, but rather only means that a liquid is located between the projection system PS and the substrate W during exposure.

Referring to FIG. 1, the illuminator IL receives a radiation beam B from a radiation source SO. The source and the lithographic apparatus may be separate entities, for example when the source is an excimer laser. In such cases, the source is not considered to form part of the lithographic apparatus and the radiation beam B is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam B, to have a desired uniformity and intensity distribution in its cross-section.

The radiation beam B is incident on the patterning device (e.g., mask) MA, which is held on the mask support structure (e.g., mask table) MT, and is patterned by the patterning device MA. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:
  a. In step mode, the patterning device support (e.g. mask table) MT or "mask support" and the substrate table WT or "substrate support" are kept essentially stationary, while an entire pattern imparted to the radiation beam B is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

b. In scan mode, the patterning device support (e.g. mask table) MT or "mask support" and the substrate table WT or "substrate support" are scanned synchronously while a pattern imparted to the radiation beam B is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

c. In another mode, the patterning device (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As described above, it can be beneficial to know the impact of a substrate support on the position of a substrate being exposed in a lithographic apparatus, and in particular, any in-plane deformations of the substrate due to the substrate support. The friction between a support table and a substrate may be particular to a specific substrate. Additionally, as the substrate support may wear down over time, the surface of the substrate support may change over time, altering the friction between a substrate and the substrate support. The friction between the substrate and the substrate support causes stress within the substrate during loading (i.e. during placement of the substrate on the substrate support), such that as described, deformations in the plane of the substrate occur. Thus, there can be issues in determining the exact position of different parts of the substrate after it has been loaded onto the substrate support. This can lead to errors when exposing a substrate being held by the substrate support. Measurement systems can be used to determine the amount of in-plane deformation due to the substrate being loaded onto a particular substrate support and/or estimate the stress in a substrate due to the substrate support. In other words, it is the stress in the substrate due to the static frictional force applied by a substrate support on the substrate. Thus, the stress in a substrate due to a substrate support can be better accounted for.

In known measuring systems, there are different ways in which in-plane stress of a substrate can be measured to estimate the effect of a substrate support being used to hold a substrate. In general, this is done by a user and can be slow, expensive and reduce availability of a lithographic apparatus for a user.

In known systems, the effect of a substrate support on a substrate may be estimated by loading a substrate onto the substrate support twice under different conditions. In one instance, the substrate is loaded with an optimal load sequence. For example, the substrate may be loaded very slowly to reduce rolling of the substrate during positioning on the substrate support. When the substrate is positioned on the substrate support using an optimal load sequence, it may be assumed that there is no in-plane deformation. In another instance, the substrate is loaded under normal circumstances, i.e. in the same way that a substrate would be positioned on the substrate support when being loaded before exposure. Measurements are taken of the substrate having been loaded with the optimal load sequence and with the normal load sequence. Comparison of measurements made of substrates having been loaded in different ways provides information relating to the in-plane deformation caused by the substrate In general measurements can be taken by measuring the position of markers on the substrate after having been loaded on the substrate support. The markers are specific features on the surface of the substrate. It is generally known where the markers should be positioned on the substrate, however, the actual position of the markers is not necessarily known as the markers may not be located in the exact correct position. As the optimal load sequence is assumed to result in no in-plane deformation, it can be used to provide information about the location of relevant markers. Thus, this measurement can be assumed to provide the actual location of the markers on the substrate.

The measurements made of the substrate having been loaded under normal loading condition can be compared to the measurements made of the substrate having been loaded under using optimal load sequence. The impact on the substrate of the substrate support can be estimated by comparing the difference in the measurements between the two load sequences. Thus, the in-plane deformation of a substrate due to a normal loading sequence on a particular substrate support can be determined and the impact of the substrate support can be estimated. This means that exposure of substrates on a substrate support can be made whilst accounting for the estimated impact of the substrate support and thus, errors and particularly overlay may beneficially be reduced. This method may be used to make measurements for DUV related lithographic apparatus, but may not be appropriate for EUV related lithographic apparatus.

Similarly, another method is known in which the effect of a substrate support on a substrate may be estimated by loading a substrate onto the substrate support under two different loading conditions. In this method, the substrate may be loaded once in the under normal circumstances, i.e. in the same way that a substrate would be positioned on the substrate support when being loaded before exposure. Additionally, the substrate may be loaded in a second manner in which the substrate with a tilt offset in the substrate. When the substrate is loaded with the tilt offset, this means that the loading is controlled so that one side of the substrate touches the substrate support first, in order to cause increased in-plane deformations on the substrate. The variation in position of markers on the substrate can be determined by comparing the difference in the measurements between the two load sequences. Thus, the effect of the substrate support on the in-plane deformation of a substrate (i.e. the stress in the substrate due to the substrate support) can be determined based on the difference in measurements taken of the markers between the different loading sequences and the stress in the substrate due to the forces applied to the substrate by the substrate table can be estimated. This method is generally used for EUV related lithographic apparatus but does not tend to be used for DUV related lithographic apparatus. As DUV and EUV related apparatus are generally measured using different methods, it is hard to directly compare results from DUV and EUV measurements.

However, these processes rely on carrying out two separate loading sequences with corresponding measurement steps. This can be very time consuming, in particular in the first method described, when loading the substrate in an optimal way in which in-plane deformation is assumed to be zero. During the loading and the measurement steps, the apparatus cannot be used as it normally would be and thus, the measurement to estimate the stress in a substrate due to the substrate support can reduce availability of the apparatus.

The above described known methods may be particularly useful to determine if a substrate support is good enough to perform (i.e. with small enough errors). In addition to this, it is noted that the parts of the substrate support which supports a substrate may deteriorate over time as the substrate support wears. This means that additional measurements may be needed over time to ensure that the changes to the substrate support, and resulting change in the deformation caused in a substrate, can be accounted for throughout the lifetime of the substrate support. As described, because these measurements can be expensive and time-consuming, providing an improved method for the user may be particularly beneficial in reducing negative impacts of these measurements for a user.

As described in detail below, the present invention may advantageously be used to avoid the need for the user to carry out two loading sequences with corresponding measurements for each loading sequence.

In the present invention, it is possible to estimate stress in a substrate due to a substrate support by taking measurements using a new type of substrate. In particular, a surface of the substrate which is in contact with the substrate support is adapted in such a way that measurements can be taken after a single loading sequence to estimate said stress.

In further detail, the present invention provides a substrate for use in a lithographic apparatus. The substrate having a support surface. The support surface may be configured for interaction with a substrate support. For example, the support surface may not comprise radiation sensitive material. The support surface may otherwise be referred to as a backside of the substrate, or a bottom surface. The support surface may be formed in such a way as to be flat to ensure that the substrate can be placed in a lithographic apparatus in a substantially flat manner.

The substrate may be the same type of substrate which is normally exposed in a lithographic apparatus, sometimes referred to as a device or production substrate. The substrate of the present invention may be referred to as a tool substrate, or a reference substrate. Thus, the substrate preferably may comprise a further surface opposite the support surface, and the further surface may comprise radiation sensitive material. The radiation sensitive material may otherwise be referred to as resist. The radiation sensitive material may be in the form of a layer on top of or forming the further surface. The substrate may be disc shaped, i.e. the substrate may be substantially circular and thin with two opposite substantially circular surfaces (i.e. the support surface and the further surface). The support surface may be substantially circular as shown in the examples in FIGS. 2 and 3. The substrate diameter may be of the order of a few hundred mm, and preferably less than 1000 mm. Preferably, the substrate diameter may be approximately 300 mm in diameter. Although it is not necessary for the support surface to be substantially circular and other shapes may be used instead.

The support surface of the substrate is divided into predefined portions. The predefined portions have a substantially uniform coefficient of friction across the relevant portions. Each of the predefined portions may have a substantially uniform coefficient of friction across the portion. The predefined portions form substantially the whole of the support surface. In other words, the support surface is divided into only the predefined portions. This means that the support surface is separated into a number of defined areas having a substantially constant coefficient of friction across said area. The predefined portions may otherwise be referred to as defined portions or zones. The predefined zones may have a minimum area, for example, a single predefined portion may be greater than or equal to approximately 5% of the area of the support surface, or preferably greater than or equal to approximately 10% of the area of the support surface. Preferably, an area of a single predefined portion is less than or equal to approximately 50% of the area of the support surface.

The predefined portions comprise at least one first portion and at least one second portion. The at least one first portion a first coefficient of friction being substantially uniform across the at least one first portion and the at least one second portion having a second coefficient of friction being substantially uniform across the at least one second portion. The second coefficient of friction is different to the first coefficient of friction. An example is shown in FIG. 2 in which a substrate W is shown with a support surface SS and wherein the first portion 1 is white and the second portion 2 is shaded in black. The further surface FS is on the opposite side of the support surface SS and is indicated by the arrow to the other side of the substrate which is not shown in FIG. 2. The first portion 1 has a substantially uniform coefficient of friction across the whole of the first portion 1. The second portion 2 has a substantially uniform coefficient of friction across the whole the second portion 2. As will be described below, additional first and/or second portions may be provided.

The coefficient of friction being substantially constant means that there is ideally no variation of the coefficient of friction across that portion. It will be understood that in reality there may be a small variation in the coefficient of friction across the area. However, variation of the coefficient of friction within any one portion will be significantly less than the difference between the coefficient of friction between different portions. The coefficient of friction may be uniform across the portion in that the variation of the coefficient of friction in any one particular portion may be less 0.05, or preferably, less than 0.01. The coefficient of friction may be measured in any appropriate way, for example, by carrying out a tribometer test.

It is shown in FIG. 2 that the whole of the support surface SS of the substrate W is divided into the first portion 1 and the second portion 2. In this particular example, the first portion 1 is shown as half of the support surface SS and the second portion 2 is shown as half of the support surface SS. In this example, there is only a single first portion 1 and a single second portion 2. In this example, the area of the first portion 1 is substantially the same as the area of the second portion 2.

There may be any suitable number of predefined portions. For example, there may be the between approximately 2 to 20 predefined portions, or more preferably between approximately 2 to 8 predefined portions. A variety of different patterns with different numbers of predefined portions are shown in FIG. 3 and will be described in further detail below. Although only first portions 1 and second portions 2 are generally described, additionally types of portions may be provided. For example, there may be at least one third portion, each third portion may have a third coefficient of friction substantially uniform across the third portion, wherein the third coefficient of friction is different to the first coefficient of friction and is different to the second coefficient of friction. Additional types of portions with corresponding frictions may be provided.

Preferably, the difference between the first coefficient of friction and the second coefficient of friction is greater than or equal to approximately 0.2, or preferably greater than or equal to approximately 0.4, or preferably greater than or equal to approximately 0.8. It may be that less work is required to alter the coefficient of friction of a surface to produce less of a difference between the friction across the different areas. This may be preferable in the production of such a substrate W. However, it may be preferable for the difference between the first and second coefficient of friction to be higher because the greater the difference between the coefficient of friction in different portions leads to a greater difference between how the different portions interact with the substrate support which may be more reliably measured. Additionally, it may be preferably for the difference in the coefficient of friction to be greater than or equal to 0.2, or higher, to reduce the effect that noise may have on the measurements.

The further surface FS may comprise a first feature positioned opposite the at least one first portion and a second feature positioned opposite the at least one second portion. In other words, a first feature (which may be measured as part of the method) may be provided to correspond to at least one of the first portions 1. Additionally, a second feature may be provided to correspond to at least one of the second portions 2. The features may be the same as the markers described above. The features may be markers on a 1 mm×1 mm grid. The features may be otherwise referred to as fiducials. The features may thus have specific shapes or configurations which are particularly useful for being accurately measured/sensed by appropriate detectors/sensors.

An indication of the location of the first feature and the second feature are shown in FIG. 2 in relation to the support surface SS and are shown by the crosses labelled F1 and F2 respectively. It may be understood that a location of the first feature (after the substrate is loaded on the substrate support) will be affected by how the first portion 1 interacts with the substrate support. Similarly, a location of the second feature (after the substrate is loaded on the substrate support) will be affected by how the second portion 2 interacts with the substrate support. This may be beneficial in allowing measurements to be taken to determine the impact of the different portions having different coefficients of friction on the features which are measured.

As already indicated, the area of the at least one first portion 1 and the at least one second portion 2 may be equal. There may be multiple first portions and/or multiple second portions. A combined area of the multiple first portions may be equal to a combined area of the multiple second portions. Although this is not necessary.

The at least one first portion 1 and the at least one second portion 2 may be provided on the support surface SS in any appropriate pattern. Various different patterns are shown in FIG. 3. The various patterns shown in FIG. 3 are based on Walsh functions, which might be used to generate a preferred pattern. As will be understood, the substrate W having a support surface SS with substantially uniform coefficient of friction is labelled $W_0$ and is an example of known substrates. Variations in accordance with the present invention are shown in FIG. 3 in substrates $W_1$-$W_{15}$. The variation on the support surface SS of $W_2$ is the same as the example described above in relation to FIG. 2. $W_3$ is the same as $W_2$ in which the orientation of the support surface SS has been rotated by 90° in the plane of the surface. In the substrate $W_1$, the support surface SS is divided into quadrants in which there are two first portions 1 and two second portions 2. This may be a preferred layout of the portions, i.e. in which the support surface SS comprises two high friction quadrants and two low friction quadrants. In the substrate $W_4$, the support surface SS is divided into circular portions of varying radial thickness. Substrates $W_5$, $W_6$ and $W_7$ have variations of the support surface SS of $W_4$ in which the support surface SS is further divided as in substrates $W_1$, $W_2$ and $W_3$ respectively. $W_8$ to $W_{15}$ are further variations showing different circular portions, some of which are further divided into quadrants or halves, as in substrates $W_1$, $W_2$ and $W_3$ respectively. Any of the example patterns could be rotated by a desired degree in the plane of the support surface SS. In particular, any of the patterns might be rotated by 45° in the plane of the support surface SS. The examples shown in FIG. 3 are not intended to be exhaustive. However, this figure shows some of the shapes which may be used for the at least one first portion 1 and the at least one second portion 2. Not all of the variations are labelled, but the figures show the support surface SS having different variations of the at least one first portion 1 (white area) and the at least one second portion 2 (black area). $W_1$ (as shown in FIG. 3 and if rotated 45° in the plane of the support surface SS) may provide a particularly useful pattern for measuring generic friction differences, and $W_5$ may provide a particularly useful pattern for measuring radius-dependent friction differences. These patterns may be particularly useful even if rotated in the plane of the support surface.

In general, the at least one first portion 1 and the at least one second portion 2 may form a circularly symmetrical pattern with respect to an axis A1, the axis A1 being formed through the centre of, and orthogonal to, the support surface SS. Such a pattern is as shown in $W_4$, $W_8$ and $W_{12}$. Additionally or alternatively, the at least one first portion 1 and the at least one second portion 2 form a pattern in a plane of support surface SS which is symmetrical with respect to an axis A2, the axis A2 being central through the support surface SS and in the plane of the support surface SS. This is as shown in $W_2$, $W_3$, $W_6$, $W_7$, $W_{10}$, $W_{11}$, $W_{14}$, and $W_{15}$.

The present invention also provides a method for estimating stress in a substrate W due to a substrate support. The stress in a substrate W from a substrate support may otherwise be referred to as a wafer load grid. The method may additionally or alternatively directly estimate the frictional force from the substrate support on the substrate W, rather than the stress in the substrate W due to the static friction applied to the substrate W by the substrate support. As described above, there are issues relating to known measurement methods which require a substrate W to be loaded onto a substrate support in different ways in order to determine a difference in how the substrate W is deformed by each loading process, i.e. to estimate/determine the effect of the substrate support on the substrate W. This can be time consuming. Additionally different types of measurement method may be used depending on whether DUV or EUV is being used. The present invention provides a method in which it is not necessary to carry out two separate loading sequences and which can thus provide measurements relating to the in-plane deformation of the substrate/estimated stress in a more efficient way. Additionally, advantageously, the present method allows measurements to be taken for both DUV and EUV such that comparisons can be more easily made.

The method of the present invention comprises, placing a substrate W on a substrate support. This is shown as S1 in FIG. 4. The substrate support may be as described above. For example, the substrate support may be the same as substrate table WT.

The substrate W has a support surface SS which is placed on the substrate support. Thus, the support surface SS may be placed in contact with the substrate support. This may be considered to be done by the same process for loading the substrate W as described in above examples.

As with the substrate described above, the support surface SS of the substrate W is divided into predefined portions. The predefined portions comprise at least one first portion 1 and at least one second portion 2. The at least one first portion 1 has a first coefficient of friction being substantially uniform across the at least one first portion 1 and the at least one second portion 2 has a second coefficient of friction being substantially uniform across the at least one second portion 2, wherein the second coefficient of friction is different to the first coefficient of friction. The substrate W comprises a further surface FS opposite the support surface SS, the further surface FS comprising a first feature F1 positioned opposite the at least one first portion 1 and a second feature F2 positioned opposite the at least one second portion 2. The substrate W may be the same as described above and may include the optional variations as described in any of the above described embodiments and/or variations.

The method further comprises measuring the location of the first feature and the second feature. This is shown as S2 in FIG. 4. This may be done using a variety of known methods or sensors, for example, using interferometric alignment sensors, such as a SMASH or Orion alignment sensor. The method further comprises estimating the stress (S3 in FIG. 4) from the substrate support on the substrate W using the measured location of the first feature F1 and the second feature F2. Thus, the method establishes the location of both the first and second feature, and then uses this information as part of the step S3 for estimating the stress due to the substrate support.

As is clear from the above-described features, this means that a measurement is taken of a feature which corresponds to a part of the substrate W in contact with the substrate support via the first portion 1, having the first coefficient of friction. Additionally, a measurement is taken of a feature which corresponds to a part of the substrate W in contact with the substrate support via the second portion 2, having the second coefficient of friction, which is different from the first coefficient of friction. The difference in the coefficient of friction between the first and second portion means that the deformation of the substrate W represented by the measurements of the first and second features can be used to estimate the stress due to the substrate support on the substrate.

The method thus relies on the taking of measurements corresponding to two portions having different coefficients of friction. The difference between the locations measured is similar to the difference between when the substrate is loaded in an optimal and normal way, or a normal and tilted way as described above. Thus, the differences measured in known techniques using two different loading scenarios can instead be measured using one substrate W in which portions of the substrate W respond to the substrate support in different ways due to the variation in coefficient of friction.

The method may optionally determine the in-plane deformation of the substrate W. Thus, the method may comprise a step of specifically determining the deformation of the substrate W caused by the substrate support. This may be useful for comparison to deformation formed by a substrate support on other substrates or for comparison to deformation formed by another substrate support on the same substrate W.

The method may use a model which estimates the stress due to the substrate support based on the measured location of the first feature F1 and the second feature F2. Additional data may be input to the model, such as expected location of the first feature F1 and the second feature F2, or the difference between the location of the first feature F1 and the first reference feature and the difference between the location of the second feature F2 and the second reference feature. The method may include determining in-plane deformation and the model may include the stress due to a substrate support as a function of the in-plane deformation. The model may also depend on information relating to the predefined portions on the support surface and the corresponding coefficient of friction in the predefined portions.

The model may be based on previous measurements providing the relationship between the relevant data and the stress due to the substrate support. This model can be used to calculate the friction of the substrate support using at least the measured location of the first feature and the second feature. The difference in the measurements taken, and particularly of the in-plane deformation, in the high and low friction areas of the substrate is a measure of friction performance of the substrate support. Using higher order shapes, e.& with larger numbers of portions, allows more complex variation in the in-plane deformation to be determined and predicted.

A single previous measurement may be used to correlate the measured location and information to an estimated stress due to the substrate support. Thus, the measurements made in the present method may be compared to at least one previous measurement made and the stress may thus be estimated using this previously measured relationship.

In an embodiment, the method may comprise using information relating to the position of the features in order to compare said information to the measured values to estimate the stress. In further detail, the method may further comprise obtaining data indicating an expected location of the first feature and an expected location of the second feature. The step of estimating the stress due to a substrate support on a substrate W may use the measured location of the first feature F1 and the second feature F2 and the data indicating the expected location of the first feature and the second feature. The data indicating the location of the first feature F1 and the second feature F2 may be based on at least one measurement using a known substrate support.

The expected location of the first feature F1 and the second feature F2 may be the actual location of the first feature F1 and the second feature F2 on the substrate W in a scenario in which there is no in-plane deformation. This may be determined by measuring the features on the substrate W using a known substrate support, e.g. using a substrate support wherein the impact of the in-plane deformation on the substrate support is known such that the measurements can be used to determine the expected location of the first feature and the second feature. In other words, the step of obtaining the data indicating the location of the first feature F1 and the second feature F2 may comprise placing the substrate W on a different substrate support and measuring the location of the first feature F1 and the second feature F2. The data may be from measurements taken on multiple different substrate supports. Ideally, the different substrate support(s) used to obtain the data indicating the location of the first feature F1 and the second feature F2 is/are ideally well performing substrate supports with little and/or well known impact on the in-plane deformation of the substrate.

In this embodiment, the step of estimating stress may comprise determining the difference between the measured location of the first feature F1 relative to the expected location of the first feature and determining the difference between the measured location of the second feature F2 relative to the expected location of the second feature. The estimating step may further comprise comparing the difference for the first feature and the second feature. Thus, the stress may be estimated by comparing how the features on the substrate are positioned once placed on the substrate support compared to where they are expected, using the known variation in the coefficient of friction relating to the different features.

The method in the above embodiment uses features having been exposed on a substrate W and having been pre-measured, for example using a known measuring system to obtain the location of the features on the further surface. However, the method may be carried out in an alternative way in which features are provided on a further surface, but have not already been measured using a known measuring system. In this alternative embodiment, the substrate W may be provided with features as described above. However, in this alternative embodiment, the method may comprise exposing additional features on the substrate and measuring the comparative location of the features as described in further detail below.

In further detail, the method of this embodiment comprises exposing the further surface FS of the substrate W to radiation to form a first reference feature on the further surface FS corresponding to the first feature F1 and a second reference feature on the further surface FS corresponding to the second feature F2. The first reference feature may be exposed to be in the same position as the first feature F1, e.g. using the same patterning device/patterned radiation beam as used to form the first feature F1. Similarly, the second reference feature may be exposed to be in the same position as the second feature F2, e.g. using the same patterning device/patterned radiation beam as used to form the second feature F2. As the substrate W will have in-plane deformation due to interaction with the substrate support, the first and second reference features will not be formed on the substrate W in the exact same position as the first and second features respectively.

In this embodiment, measuring the location of the first feature F1 comprises measuring the location of the first feature F1 with respect to the first reference feature and measuring the location of the second feature F2 comprises measuring the location of the second feature F2 with respect to the second reference feature. In this way, the measuring step allows the determination of the difference between the location of the first feature and the first reference feature, and between the second feature and the second reference feature. In this way, the relative position of the first feature and the first reference feature may be measured directly, or may be calculated by comparing the measured location of the first feature and the first reference feature. The same applies to the second reference feature. In this method, the step of estimating stress due to a substrate support on a substrate is based on the determined difference.

In this embodiment, the method may further comprise the step of exposing the further surface FS of the substrate W to radiation, using a different substrate support, to form the first feature F1 and the second feature F2. Ideally, the exposure of the substrate W to form the first feature F1 and the second feature F2 is carried out using a substrate support wherein the impact of the substrate support on the substrate W, i.e. the deformation induced in the substrate by the substrate support, is known.

In these embodiments, only a single measurement step may be needed. In other words, after the substrate W has been loaded (and optionally exposed depending on the embodiment), measurements may be taken without further steps of re-loading or further exposing the substrate. Thus, it is not necessary to carry out multiple, possibly very time consuming, loading steps to measure the in-plane substrate deformation as in previously known methods. Additionally, the measurements could be used for warped substrates, e.g. after a top coat is applied to the substrate already having the support surface divided into the portions. This might be beneficial in providing measurements even more closely representative of customer performance. Furthermore, a substrate used for measuring by a customer could be coated in portions to provide more accurate estimation of the stress which might be caused by a substrate support.

Additionally, the types of substrate described as part of the present invention can be included in normal system stability runs where a substrate is frequently measured, e.g. every day. In a normal system stability run, the performance may be measured and the system can be corrected to keep performance stable. Therefore, these substrates can be included in recurring system calibration work flows to keep in-plane substrate slip behaviour stable.

An additional advantage is that the in-plane deformation/friction of the substrate support can be measured in full customer circumstances rather than on a dried immersion system. In further detail, an immersion scanner substrate table is typically wet and may run in very fast cycles (for example, at 30 s per substrate) which keeps the wetness state constant. The types of measurement methods previously used generally take approximately 20 minutes which causes the system to dry up and may have negative impacts due to thermal variations. Consequently, to provide measurements with the required degree of accuracy using known measurement methods, the system generally has to be drained, allowed to dry and then measurements can be taken. This can take a significant period of time. The method described in the present invention may be much quicker, and thus, the system can remain stable within the timeframe allowed for the measurements. This allows the system to use the fast substrate exposure cycle such that the draining and drying are no longer required.

The present invention comprises a system configured to carry out the method according to any of the above embodiments or variations. The system may comprise a processor configured to receive the measured location of the first feature and the second feature and estimate the stress due to a substrate support on a substrate using the measured location of the first feature and the second feature. For example, a processor PR as shown in FIG. 1 may be used. The processor PR may receive the measurement information from at least one sensor such as sensor S. The sensor S may send measured information to the processor wirelessly, or using wires (not depicted). The system may be a lithographic apparatus as in FIG. 1, or may be part of a lithographic apparatus. The lithographic apparatus may comprise some but not all of the components described above in relation to FIG. 1.

The present invention further comprises a method for making a substrate as described in any of the above embodiments and/or variations. The method comprises providing a substrate for use in a lithographic apparatus. This is shown as S10 in FIG. 5. The substrate W having a support surface SS and a further surface FS opposite the support surface SS. The method may include processing may the support surface SS to generate at least one first portion 1 having the first coefficient of friction being substantially uniform across the at least one first portion 1 (as in step S11 of FIG. 5) and/or at least one second portion 2 having the second coefficient of friction being substantially uniform across the at least one second portion 2 (as in step S12 of FIG. 5). As described above, the support surface SS may be divided into predefined portions, the predefined portions comprising the at least one first portion 1 and the at least one second portion 2. Furthermore, each of the predefined portions may have a substantially uniform coefficient of friction across said portion.

The step of processing may be carried out in a variety of ways to generate the desired coefficient of friction in the desired areas. For example, and as described in further detail below, the processing may include engineering the surface energy (e.g. using DLC, HMDS, and/or a polymer), the contact area (e.g. using nanowaves and pillars) and/or or the roughness (which is contact area indirectly)

In further detail, the processing may comprise coating the at least one first portion and/or the at least one second portion, and optionally, using a mask. For example, the processing may comprise coating the at least one first portion and/or the at least one second surface by forming a layer of hexamethyldisilazane (HMDS), polysilicon, chromium nitride (CrN), diamond-like carbon (DLC), graphite and/or a low friction polymer, such as teflon. The processing may comprise etching lines, optionally using a mask, in the at least one first portion and/or the at least one second portion. For example, the etching may comprise the use of nanopillars and/or nanowaves. The processing may comprise scratching across the at least one first portion and/or the at least one second portion. The processing may comprise generating homogeneous roughness. The processing may comprise any combination of these methods. Advantages of using physical methods (e.g. scratching) to alter the coefficient of friction of any of the portions include that there may be no chemical interaction with the substrate support, and/or the change in friction may be more robust, and/or these methods do not physically deform the substrate in the form of stress and/or warp.

The method described above for estimating stress in a substrate W due to a substrate support may further comprise the method for producing the substrate W to be placed in the substrate support using any method or combination of methods described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tool 1s. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The descriptions above are intended to be illustrative, not limiting. Thus, it will be apparent to one skilled in the art that modifications may be made to the invention as described without departing from the scope of the claims set out below.

The invention claimed is:

1. A method comprising:
   placing a substrate on a substrate support, the substrate having a support surface that is placed on the substrate support, wherein:
   the support surface of the substrate is divided into predefined portions,
   the predefined portions comprise at least one first portion and at least one second portion,
   the at least one first portion having a first coefficient of friction being substantially uniform across the at least one first portion,
   the at least one second portion having a second coefficient of friction being substantially uniform across the at least one second portion,
   the second coefficient of friction is different to the first coefficient of friction, and
   the substrate comprises a further surface opposite the support surface, the further surface comprising a first feature positioned opposite the at least one first portion and a second feature positioned opposite the at least one second portion;

measuring a location of the first feature and the second feature; and estimating stress in the substrate due to the substrate support using the measured location of the first feature and the second feature.

2. The method of claim 1, further comprising:

obtaining data indicating an expected location of the first feature and an expected location of the second feature, wherein the estimating the stress in the substrate uses the measured location of the first feature and the second feature and the data indicating the expected location of the first feature and the second feature.

3. The method of claim 2, wherein the estimating the stress in the substrate comprises:

determining a difference between the measured location of the first feature relative to the expected location of the first feature;

determining a difference between the measured location of the second feature relative to the expected location of the second feature; and comparing the difference for the first feature and the second feature.

4. The method of claim 2, wherein obtaining the data indicating the expected location of the first feature and the second feature comprises placing the substrate on a different substrate support and measuring the location of the first feature and the second feature.

5. The method of claim 1, further comprising:

exposing the further surface of the substrate to radiation to form a first reference feature on the further surface corresponding to the first feature and a second reference feature on the further surface corresponding to the second feature, wherein measuring the location of the first feature comprises measuring the location of the first feature with respect to the first reference feature and measuring the location of the second feature comprises measuring the location of the second feature with respect to the second reference feature;

determining a difference between the location of the first feature and the first reference feature, and between the second feature and the second reference feature; and estimating the stress in the substrate based on the determined difference.

6. The method of claim 5, further comprising, using a different substrate support, exposing the further surface of the substrate to radiation to form the first feature and the second feature.

7. A substrate for use in a lithographic apparatus, the substrate comprising:

a support surface configured to interact with a substrate support, wherein:

the support surface of the substrate is divided into predefined portions, the predefined portions comprise at least one first portion and at least one second portion, the at least one first portion having a first coefficient of friction being substantially uniform across the at least one first portion, the at least one second portion having a second coefficient of friction being substantially uniform across the at least one second portion, the second coefficient of friction being different to the first coefficient of friction, and wherein a difference between the first coefficient of friction and the second coefficient of friction is greater than or equal to approximately 0.2, greater than or equal to approximately 0.4, or greater than or equal to approximately 0.8.

8. The substrate of claim 7, wherein the substrate comprises a further surface opposite the support surface, the further surface comprising a first feature positioned opposite the at least one first portion and a second feature positioned opposite the at least one second portion.

9. The substrate of claim 7, wherein the further surface comprises radiation sensitive material.

10. The substrate of claim 7, wherein the at least one first portion and the at least one second portion form a circularly symmetrical pattern with respect to an axis, the axis being formed through the center of, and orthogonal to, the support surface.

11. The substrate of claim 7, wherein the at least one first portion and the at least one second portion form a pattern in a plane of the support surface that is symmetrical with respect to an axis, the axis being central through the support surface and in the plane of the support surface.

12. The substrate of claim 7, wherein there are multiple first portions and multiple second portions, and a combined area of the multiple first portions is equal to a combined area of the multiple second portions.

13. A method comprising:

placing a substrate on a substrate support, wherein:

the substrate comprises a support surface that is placed on the substrate support, the support surface of the substrate is divided into predefined portions, the predefined portions comprise at least one first portion and at least one second portion, the at least one first portion having a first coefficient of friction being substantially uniform across the at least one first portion, the at least one second portion having a second coefficient of friction being substantially uniform across the at least one second portion, the second coefficient of friction is different to the first coefficient of friction, and the substrate comprises a further surface opposite the support surface, the further surface comprising a first feature positioned opposite the at least one first portion and a second feature positioned opposite the at least one second portion;

measuring a location of the first feature and the second feature; and estimating stress in the substrate due to the substrate support using the measured location of the first feature and the second feature.

14. A method of producing a substrate comprising:

a support surface configured to interact with a substrate support, wherein:

the support surface of the substrate is divided into predefined portions, the predefined portions comprise at least one first portion and at least one second portion, the at least one first portion having a first coefficient of friction being substantially uniform across the at least one first portion, and the at least one second portion having a second coefficient of friction being substantially uniform across the at least one second portion, the second coefficient of friction being different to the first coefficient of friction, and a difference between the first coefficient of friction and the second coefficient of friction is greater than or equal to approximately 0.2, greater than or equal to approximately 0.4, or greater than or equal to approximately 0.8;

providing the substrate for use in a lithographic apparatus, the substrate having a support surface and a further surface opposite the support surface; and processing the support surface to generate at least one first portion having the first coefficient of friction being substantially uniform across the at least one first portion and/or at least one second portion having the second coefficient of friction being substantially uniform across the at least one second portion.

15. The method of claim 14, wherein the processing comprises at least one of:

coating the at least one first portion and/or the at least one second portion;

etching across the at least one first portion and/or the at least one second portion; and scratching across the at least one first portion and/or the at least one second portion.

* * * * *